United States Patent
Lippert et al.

(10) Patent No.: US 8,848,167 B2
(45) Date of Patent: Sep. 30, 2014

(54) OPTICAL ELEMENT FOR UV OR EUV LITHOGRAPHY WITH COATINGS HAVING OPTIMIZED STRESS AND THICKNESS

(75) Inventors: Johannes Lippert, Buch am Wald (DE); Dirk Schaffer, Jena (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 642 days.

(21) Appl. No.: 13/208,823

(22) Filed: Aug. 12, 2011

(65) Prior Publication Data
US 2012/0044473 A1 Feb. 23, 2012

Related U.S. Application Data

(60) Provisional application No. 61/375,069, filed on Aug. 19, 2010.

(51) Int. Cl.
*G02B 1/10* (2006.01)
*G03F 7/20* (2006.01)

(52) U.S. Cl.
CPC .............. *G02B 1/10* (2013.01); *G03F 7/7015* (2013.01); *G03F 7/70316* (2013.01)
USPC .......................................................... 355/67

(58) Field of Classification Search
CPC ............ G03F 7/70983; G03F 7/70958; G03F 7/7015; G03F 7/70316; C23C 16/44; C23C 16/455; C23C 16/4582; C23C 16/54
USPC .......................................................... 355/67
See application file for complete search history.

(56) References Cited

U.S. PATENT DOCUMENTS

| | | | |
|---|---|---|---|
| 2006/0087739 A1 | 4/2006 | Ockenfuss et al. | |
| 2007/0111490 A1 | 5/2007 | Okubo et al. | |
| 2008/0042079 A1 | 2/2008 | Singer et al. | |
| 2008/0123073 A1* | 5/2008 | Shiraishi et al. | 355/67 |
| 2010/0321649 A1 | 12/2010 | Baer | |

FOREIGN PATENT DOCUMENTS

| | | |
|---|---|---|
| DE | 10134157 A1 | 2/2003 |
| DE | 10 2009 029 776 B3 | 12/2010 |
| DE | 10 2009 040 785 A1 | 3/2011 |
| DE | 10 2011 076 549 A1 | 11/2012 |

* cited by examiner

*Primary Examiner* — Peter B Kim
*Assistant Examiner* — Michelle Iacoletti
(74) *Attorney, Agent, or Firm* — Edell, Shapiro & Finnan, LLC

(57) ABSTRACT

To reduce deformations which may be caused by a functional coating on a substrate in an optical element for UV or EUV lithography, an optical element is suggested comprising a functional coating (46) on a first surface (42) of a substrate (41), wherein the substrate (41) comprises a second surface (43) having a common edge (45) with the first surface (42), and the second surface (43) also has a coating (47) and the thickness $t_2$ and the stress $\sigma_2$ of the coating (47) on the second surface (33, 43) are chosen such that, in combination with the thickness $t_1$ and the stress $\sigma_1$ of the functional coating (36, 46) on the first surface (32, 42), the condition $$\frac{t_1 \cdot \sigma_1}{t_2 \cdot \sigma_2} = X$$

is fulfilled, wherein X has a value between 0.8 and 5.0.

20 Claims, 9 Drawing Sheets

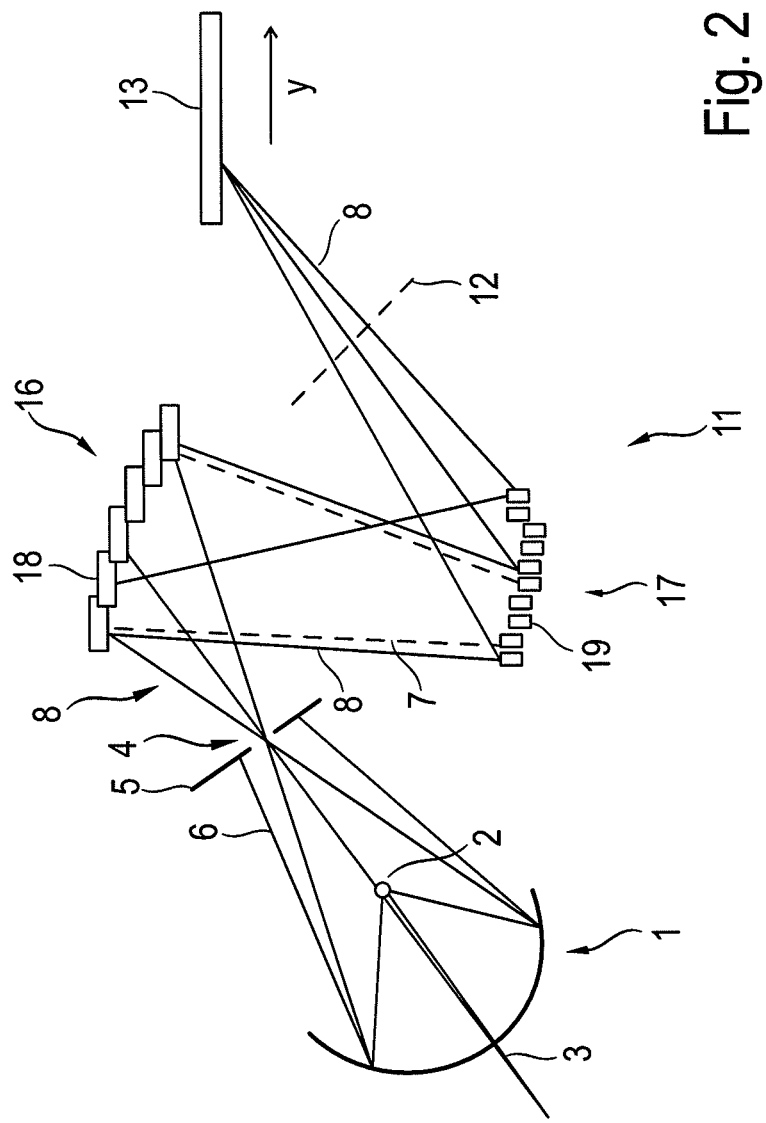

OPTICAL ELEMENT FOR UV OR EUV LITHOGRAPHY WITH COATINGS HAVING OPTIMIZED STRESS AND THICKNESS

The following disclosure is based on German Patent Application No. DE 10 2010 039 496.3 filed on Aug. 19, 2010, which is incorporated into this application by reference.

The present invention relates to an optical element for UV or EUV lithography which comprises a functional coating on a first surface of a substrate, wherein the substrate comprises a second surface having a common edge with the first surface. Furthermore, the present invention relates to an illumination system for a UV or EUV lithography apparatus, or to a lithography apparatus for the ultraviolet or extreme ultraviolet wavelength ranges with such an optical element.

BACKGROUND

To be able to produce ever finer structures with lithographic methods in the production of semiconductor components, light of an increasingly shorter wavelength is used. When working in the extreme ultraviolet (EUV) wavelength range, for example, at wavelengths between about 5 nm and 20 nm, it is no longer possible to work with lens-like elements in the transmission mode, rather illumination and projection objectives of mirror elements are constructed, having reflective coatings adapted to each working wavelength. When using working wavelengths in the ultraviolet (UV) wavelength range, e.g. at 248 nm, 193 nm or 157 nm, reflective optical elements can also be used. At UV wavelengths optical elements are primarily used that work in the transmission mode. The optical elements usually have a substrate which, on a first surface, has a functional coating that serves to optimize the reflectivity or transmission of the desired working wavelength on the optical element.

SUMMARY

One problem is that the materials of the coating on the one hand and the substrate on the other differ with respect to their physical properties, e.g. coefficient of thermal expansion, elasticity module and the like, so that stresses can arise in the optical element which can lead to mechanical deformations of the optical element, in turn leading to imaging errors.

It is therefore an object of the present invention to provide an optical element for UV or EUV lithography in which mechanical deformations are kept as small as possible.

The object is achieved, in one formulation, by an optical element for UV or EUV lithography which, on a first surface of a substrate, comprises a functional coating, wherein the substrate comprises a second surface, which has a common edge with the first surface and comprises a coating, wherein the thickness $t_2$ and the stress $\sigma_2$ of the coating on the second surface, in combination with the thickness $t_1$ and the stress $\sigma_1$ of the functional coating on the first surface, fulfill the condition $$\frac{t_1 \cdot \sigma_1}{t_2 \cdot \sigma_2} = X,$$

wherein X has a value between 0.8 and 5.0.

It has been found that providing additional coatings, in particular on a surface which has a common edge with the surface having the functional coating, can influence the deformation effects resulting from the composite of the functional coating and the substrate. For this purpose the thickness $t_2$ and the stress $\sigma_2$ of the coating on the second surface are selected such that, in combination with the thickness $t_1$ and the stress $\sigma_1$ of the functional coating on the first surface, the condition $t_1 * \sigma_1 / t_2 * \sigma_2 = X$ is fulfilled, wherein X has a value between 0.8 and 5.0, preferably between 1.2 and 3.0, particularly preferably between 1.4 and 1.8. Advantageously, values for the thicknesses and stresses are assumed which are prevalent at the operating temperature at which the reflective optical element in question is to be used. In particular, deformations resulting in the edge area can be influenced and even largely compensated by a suitably selected coating on a surface adjacent to the edge. This is advantageous with optical elements, in particular, which are illuminated and optically used also in the edge area.

In preferred embodiments, the functional coating of the optical element is formed as an optically effective coating and/or polishable coating. In optical elements for UV lithography, in particular, it may be sufficient in a given case to provide only an optically effective coating, such as an antireflective coating, or a highly reflective coating of one or more layers, and to provide only one polishable coating acting, for example, as an additional reflective coating. With optical elements for the EUV lithography apparatus, preferably, both a polishable coating, advantageously polished to an average surface roughness (rms roughness, i.e. root mean square roughness) in the high-frequency local frequency area, i.e. at local frequencies between about 10 nm$^{-1}$ and 1000 nm$^{-1}$, of at most 0.5 nm, preferably at most 0.2 nm, and an optically effective coating, preferably a high-reflectivity coating of a plurality of layers, are combined. However, optical elements for EUV lithography used, for example, with reflection for grazing incidence, can comprise a polishable coating, preferably of metal, as a functional coating.

Advantageously, the functional coating of the first surface and/or the coating on the second surface extend to the common edge. Deformation in the edge area can thus be particularly well influenced.

Preferably, the material and/or the thickness of the coating on the second surface are such that tensile stresses or compressive stresses are present both in the functional coating on the first surface and in the coating on the second surface respectively. If both in the functional coating and in the coating for influencing the mechanical deformation, similar stresses are present, i.e. either tensile stresses or compressive stress, it has been shown that the deformation effects caused by the stresses in the functional coating are particularly advantageously compensated by the coating on the second surface.

In a preferred embodiment, the stress $\sigma_2$ of the coating on the second surface is selected to be equal to the stress $\sigma_1$ of the functional coating on the first surface, so that the condition $t_1/t_2 = X$ is fulfilled, wherein X has a value between 0.8 and 5.0, preferably between 1.2 and 3.0, particularly preferably between 1.4 and 1.8. By selecting, for example, a coating which matches the functional coating with respect to type and material, as coating on the second surface, the stresses $\sigma_1$ and $\sigma_2$ will be the same or comparable in both coatings, so that a corrective effect is achieved simply by choosing $t_1/t_2 = X$ as the thickness ratio.

In a further preferred embodiment, wherein the substrate has a third surface opposite the first surface, the third surface also has a coating. This is particularly suitable for influencing deformations extending across the surface area of the functional coating, or the first surface of the substrate.

In this case, the thickness $t_3$ and the stress $\sigma_3$ of the coating on the third surface are preferably such that the product of the thickness $t_3$ and the stress $\sigma_3$ of the coating on the third surface is equal to the product of the thickness $t_1$ and the stress $\sigma_1$ of the functional coating on the first surface. Deformations induced by stresses in the composite of the functional coating and the substrate across the entire reflective optical element can thus be largely compensated.

Preferably, the coefficient of thermal expansion of both the functional coating and the coating on the second surface, is either higher or lower than the coefficient of thermal expansion of the substrate. This is particularly advantageous with edge deformations, which are largely due to thermally induced stresses. The greater the difference between the coefficient of thermal expansion of the coating on the second surface and the substrate, the better the edge deformation can be compensated even by small thicknesses of the coating on the second surface.

In other variants, the coefficient of thermal expansion of the coating on the second surface is about equal to the coefficient of thermal expansion of the substrate. This is advantageous for edge deformations, in particular, which are mainly caused by intrinsic stresses, which are due to the coating methods used for each functional coating. Also for the case of largely thermally induced edge deformations, the difference between the coefficient of thermal expansion of the coating on the second surface and the coefficient of thermal expansion of the substrate can be chosen to be rather small. This has the advantage that the coating on the second surface can thus be thicker and can consequently allow greater manufacturing tolerances.

In further variants, in which the edge deformations are largely caused by growth induced layer stresses in the functional coating, the coefficient of thermal expansion of the coating on the second surface advantageously has the same sign as the coefficient of thermal expansion of the substrate, to reduce the influence of possible additional thermally induced layer stresses and to be able to compensate the edge deformation as well as possible. Preferably and additionally, the coefficient of thermal expansion of the coating on the second surface is about equal to the coefficient of thermal expansion of the substrate, to enhance this effect.

Advantageously, the coating on the second surface includes one or more materials from the group comprising silicon, nickel-phosphorus alloys, diamond-like carbon, molybdenum, silicon dioxide. On the one hand, these materials are materials which can be excellently polished to a particularly low roughness in the high-frequency local frequency range, such as amorphous silicon, silicon dioxide or nickel-phosphorus alloy. On the other hand, they are materials which can also be used for the functional coating, such as molybdenum and silicon, of which multilayer systems are made for reflective optical elements in the EUV range.

Preferably, the substrate is fashioned of a material from the group comprising copper, copper alloy, aluminum, aluminum alloy, aluminum-silicon alloy, steel, glass, fused silica, doped fused silica, titanium-doped fused silica, glass ceramic, calcium fluoride, silicon carbide, silicon-silicon carbide, silicon, wherein it can include other materials in small quantities. The materials mentioned above are all suitable as substrates for reflective optical elements in the EUV range. Glass, in particular fused silica, and calcium fluoride, can also be used in transmissive optical elements for the UV range.

In a particularly preferred embodiment, the optical element is formed as a facet of a facet mirror. Facet mirrors are composed of small-scale facets, which are usually illuminated over their entire surface area, thus also up to the edge area, and are to contribute to reflection across their entire surface area. Deformations in the edge area of the individual facets are thus particularly disruptive with facet mirrors. Providing a coating on a second surface having a common edge with the first surface comprising the functional coating to counteract deformation in the edge area, is thus particularly effective in the case of facet mirrors.

In a further particularly preferred embodiment, the optical element is formed as a mirror segment of a mirror segment array. With reflective optical elements for EUV lithography, in particular, mirror surface areas are sometimes reached as the image-side numerical aperture increases, which entail enormous technological manufacturing and cost overhead. With increasing dimensions of the mirrors, larger processing machines are needed for fabrication, and more stringent requirements apply to the processing and measuring tools used. Moreover, the manufacture of larger reflective optical elements requires correspondingly heavier substrates which, as of a certain size limit, can hardly be mounted, or which bend beyond an acceptable degree due to the gravitational pull. One way to control this problem is to form large mirrors of a plurality of mirror segments as a mirror segment array. Just like the facets of a facet mirror, the mirror segments are illuminated to surface areas, which also include the edge areas of the mirror segments, so that deformations in the edge area of the individual mirror segments have a particularly interfering effect. The provision of a coating on a second surface having a common edge with the first surface, which has a functional coating, in order to counteract deformations in the edge area, is thus particularly effective even in the case of mirror segments.

Furthermore, the object is also addressed by an illumination system for a UV or EUV lithography apparatus, comprising at least one optical element as described above, or by a lithography apparatus for the ultraviolet or extreme ultraviolet wavelength ranges, comprising at least one such optical element.

The above and further features can be implemented from the claims as well as from the description and the drawings, wherein the individual features, alone or in combination, can be realized in the form of subcombinations in respective embodiments of the invention and also in other fields, and can represent advantageous embodiments that can be protected in their own right.

BRIEF DESCRIPTION OF THE DRAWINGS

The present invention will be explained with reference to a preferred exemplary embodiment in more detail, wherein:

FIG. 2 schematically shows an embodiment of an illumination system;

DETAILED DESCRIPTION

Figure 1:
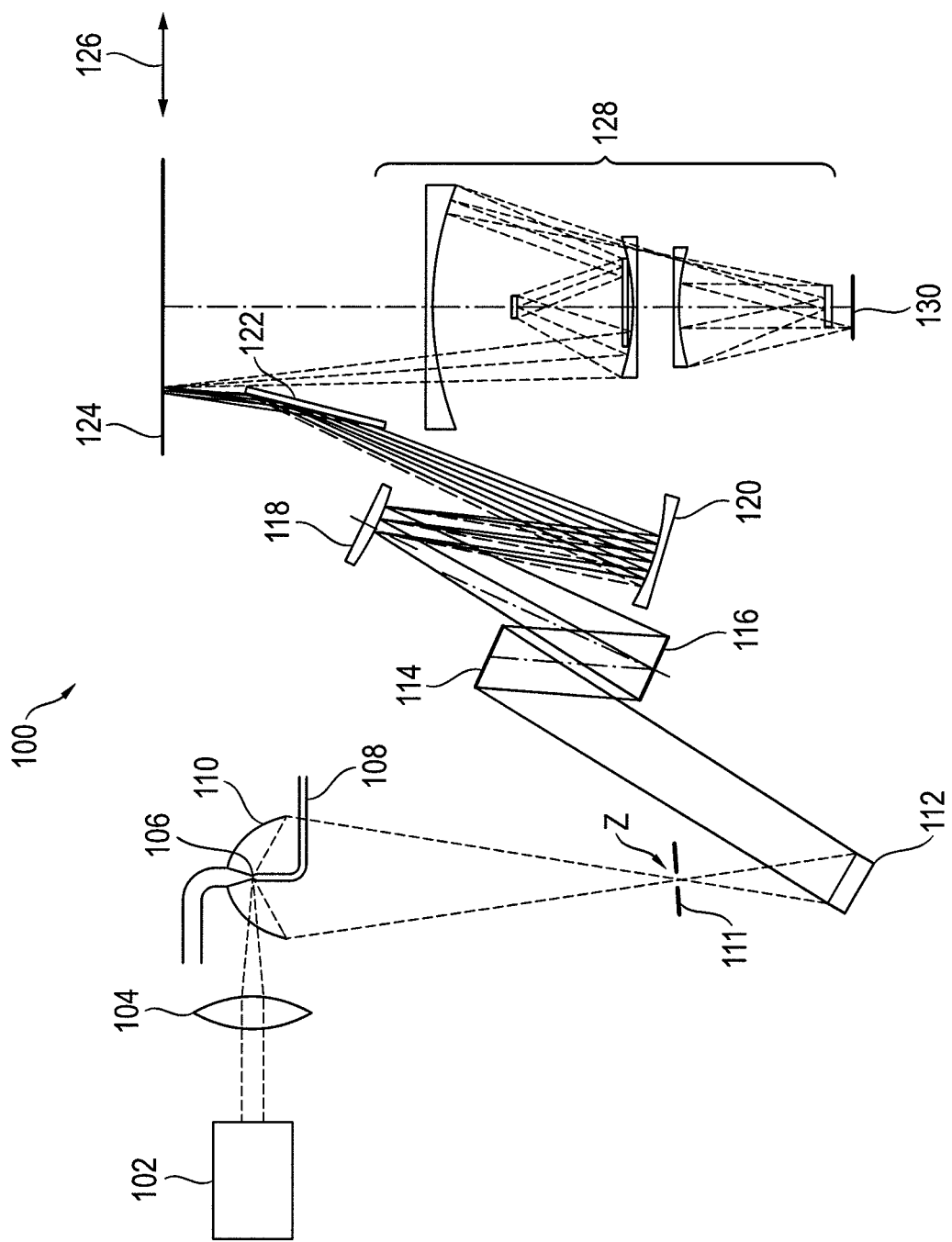
FIG. 1 schematically shows an embodiment of an EUV lithography apparatus.

FIG. 1 is a principle diagram of an EUV lithography apparatus 100 for the production of, for example, microelectronic components. This apparatus 100 is operated, in the example shown, in a scanning mode along a scanning direction 126 at a working wavelength in the EUV range, and which can include one or more optical elements with additional coating. EUV lithography apparatus 100 shown in FIG. 1 includes a point-shaped plasma radiation source. The radiation of laser source 102 is directed, via a condenser lens 104, onto a suitable material introduced via inlet 108 and excited to a plasma 106. The radiation emitted by the plasma 106 is imaged onto intermediate focus Z by collector mirror 110. Suitable diaphragms 111 on intermediate focus Z ensure that no undesirable scattered radiation impinges on subsequent mirrors 112, 114, 116, 118, 120 of the illumination system of EUV lithography apparatus 100. Planar mirror 122 serves to fold the system in order to provide space for mechanical and electronic components in the object plane in which the support for reticle 124 is arranged. A field facet mirror 114 and a pupil facet mirror 116 follow mirror 112 in the present example in the illumination system. Field facet mirror 114 serves to project a plurality of images of the radiation source of the EUV lithography apparatus into a pupil plane in which a second facet mirror is arranged having the function of a pupil facet mirror 116, which overlaps the images of the facets of field facet mirror 114 in the object plane to achieve as homogeneous an illumination as possible. Mirrors 118 and 120 arranged subsequent to facet mirrors 114 and 116, essentially serve to shape the field in the object plane. To minimize edge deformations, in particular, facet mirrors 114, 116, in addition to a highly reflective coating on their surface illuminated with EUV radiation, have a coating on a side surface having a common edge with the illuminated surface, as will be explained in more detail further below. A structured reticle 124 is arranged in the object plane, the structure of which is imaged onto object 130 to be exposed, such as a wafer, via a projection objective 128, which has six mirrors in the present example. Reticle 124 in EUV lithography apparatus 100, configured as a scanning system in the present case, is displaceable in the indicated direction 126 and is successively partially illuminated to project any structures of reticle 124, with the projection objective, for example, onto a wafer 130.

FIG. 2 shows a radiation source in combination with an illumination system 11, which is part of a projection illumination apparatus for EUV lithography, as shown for example, in FIG. 1. A collector 1 is arranged partly covering a light source formed by a plasma droplet 2 excited by an infrared laser 3. To obtain wavelengths in the range of, for example, around 13.5 nm in the EUV wavelength range, tin can be excited to a plasma with a carbon dioxide laser working at a wavelength of 10.6 µm. Solid state lasers, for example, could also be used instead of a carbon dioxide laser. Downstream of diaphragm 5, collector 1 is followed, at intermediate focus 4, by a field facet mirror 16 with individual facets 18 and a pupil facet mirror 17 with individual facets 19, wherein facets 18, 19, in particular, have an additional coating for compensating deformations due to the functional coating of facets 18, 19. Before the radiation impinges on reticle 13 to be scanned in the y direction, with the structure to be projected onto a wafer, it is first redirected by a folding mirror 12. Folding mirror 12 does not so much have an optical function, rather it serves to optimize the space requirements of illumination system 11.

It should be noted that various radiation sources can be used in UV or EUV lithography, such as plasma sources, which could be based on laser excitation (LPP sources) or gas discharge (DPP sources), synchrotron radiation sources or free electron lasers (FEL). Furthermore, the collectors can be of any desired configuration, such as Wolter collectors or ellipsoid collectors, preferably adapted to the respective radiation source used. The illumination system of a projection illumination apparatus can also have any particular configuration, and can include honeycomb condensers, specular reflectors, moveable optical components and the like in addition or even instead of the facet mirrors.

It should also be noted that the examples shown here of a lithography apparatus or an illumination system can be modified as needed or desired. In particular, for their use with working wavelengths in the UV wavelength range, individual, several or all of the optical elements can be formed as lenses.

Figure 3C:
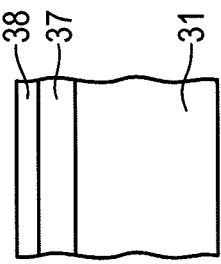
FIGS. 3a-c schematically show a conventional optical element.
Figure 3B:
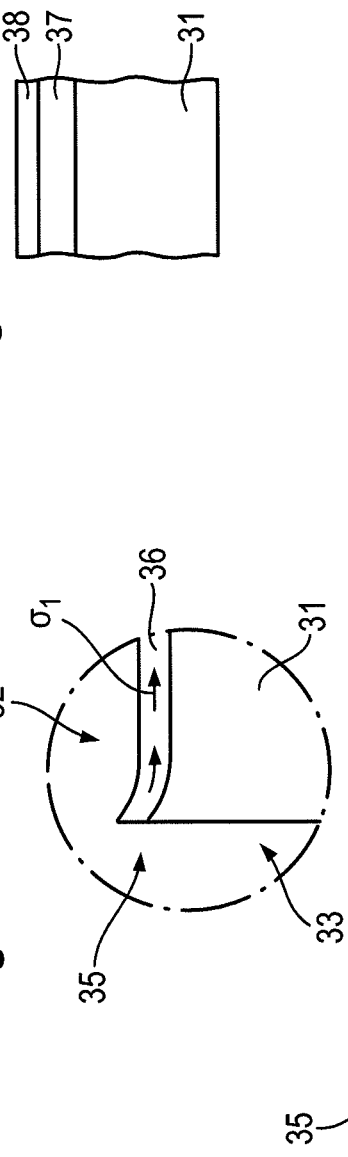
Figure 3A:
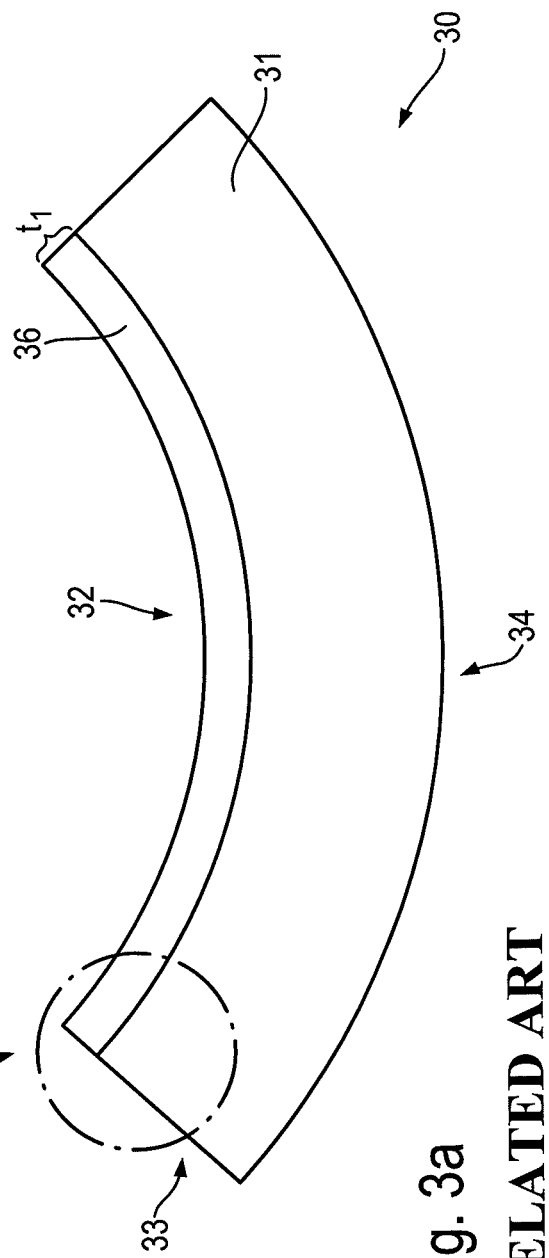

FIG. 3a shows a principle diagram of a conventional optical element 30, which is a composite of a substrate 31 with a functional coating 36 on a first surface 32 of the substrate 31. Optical element 30 can be, for example, a facet mirror as explained with reference to FIGS. 1 and 2, or a different type of mirror, a mask or a lens element for the UV range, or the like.

In the example shown here, functional coating 36 extends across the entire surface area of first surface 32 up to the edges, in particular up to edge 35, which first surface 32 has in common with second surface 33 of substrate 31. Third surface 34 is opposite first surface 32. Functional coating 36 can be, for example, a layer of excellently polishable material 37, such as nickel phosphorus alloys, amorphous silicon or silicon dioxide, or diamond-like carbon, or can be an optically effective coating 38, such as an antireflective or highly reflective layer system (cf. FIG. 3c), or it can be an optically effective coating on an excellently polishable coating. For use in the extreme ultraviolet wavelength range, in particular, highly reflective layer systems in the form of multilayer systems are preferred. If necessary, an adhesion promoting layer can be provided between substrate 31 and functional coating 36.

The multilayer systems are alternately applied layers of a material having a higher real part of the refractive index at the working wavelength (also referred to as a spacer) and a material having a lower real part of the refractive index at the working wavelength (also referred to as an absorber), wherein an absorber-spacer pair forms a stack. This essentially imitates a crystal, in which the lattice planes correspond to the absorber layers, on which Bragg reflection occurs. For use in the wavelength range between 12.5 nm and 15 nm, for example, molybdenum is advantageously used as an absorber material and silicon is advantageously used as a spacer material. In the ultraviolet wavelength range multilayer systems can also be used as highly reflective coatings, for example, on the basis of oxides and/or fluorides. In the case of optical elements used in the transmission mode, the optically effective coating can be a layer or a layer system to avoid reflections. The functional coating 36 can be a combination of a polishing layer 37 and an optically effective coating 38, in particular a highly reflective multilayer system. The polishing layer is polished to an average surface roughness of at most 0.5 nm, particularly preferably at most 0.2 nm, in particular for use in EUV lithography.

Substrate 34 can be of a material from the group including copper, copper alloy, aluminum, aluminum alloy, aluminum-silicon alloy, fused silica, doped fused silica, titanium-doped fused silica, glass ceramic, calcium fluoride, silicon carbide, silicon-silicon carbide, silicon.

In the example shown here, tensile stresses $\sigma_1$ are present in the functional coating 36 of thickness $t_1$, which results in the deformation of optical element 30, shown here in strong exaggeration. On the one hand, the entire optical element 30 is bent across its entire surface. Such deformations are usually relatively homogeneous and can be partially compensated in its optical effect by being combined with further optical elements, deformed in a complementary fashion. On the other hand, optical element 30 is pulled not only inwards, but also upwards, in the area of edge 35, shown enlarged in FIG. 3b, by tensile stress $\sigma_1$ arising in functional coating 36. This effect is the more pronounced the closer the edge of the coating is to the edge of the substrate, i.e. to edge 35. If the optical element is optically used up to its edge, this additional deformation is particularly disruptive for the imaging properties.

Figure 4B:
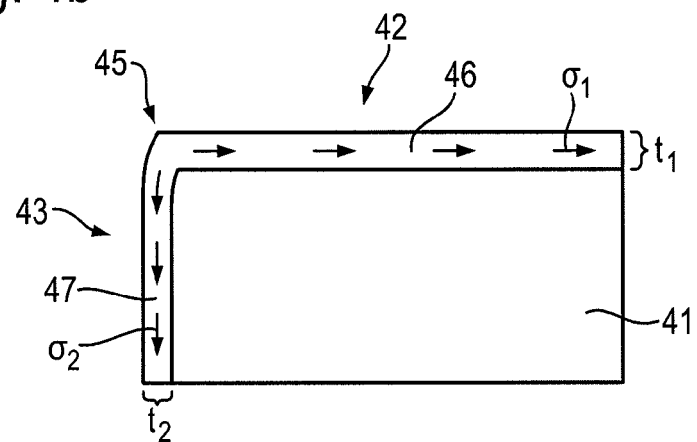
FIGS. 4a, b schematically show an embodiment of an optical element with additional coating.
Figure 4A:
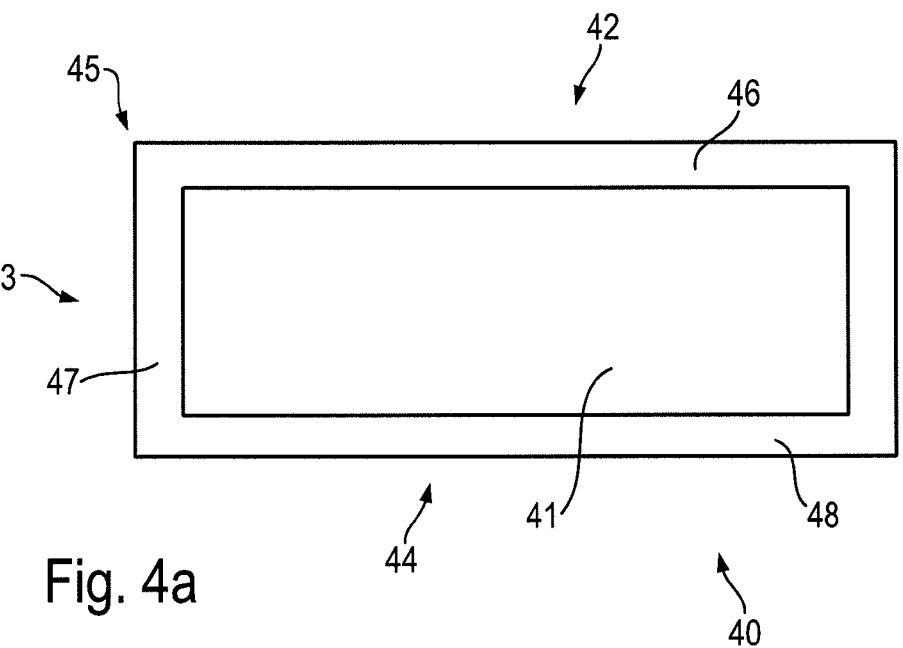

FIG. 4a schematically shows an example of an optical element 40 in which the deformation induced by the functional coating is kept as small as possible. Optical element 40 includes a substrate 41 having a functional coating 46 on a first surface 42. Unlike conventional optical elements as shown, for example, in FIGS. 3a,b, optical element 40 additionally includes a coating 47 on the second surface 43 of substrate 41, which has a common edge 45 with first surface 42. Moreover, optical element 40, in the example shown in FIG. 4a, has a third surface 44 opposite first surface 42 and also includes a coating 48. In the example shown in FIG. 4a, second surface 43 extends around the entire periphery of substrate 41, so that substrate 41 is coated on all sides.

Functional coating 46 can be, for example, a layer of a single material, or a layer system of a plurality of layers, as already explained with reference to FIGS. 3a,b. For use in the EUV wavelength range, in particular, functional coating 46 is provided with a plurality of at least two alternatingly arranged material layers to obtain high reflectivity through constructive interference of the partial beams reflected on the individual material boundaries. To compensate any roughnesses of the substrate, an additional polishable coating is provided advantageously between the substrate and the optically effective coating. Layers of nickel phosphorus alloys, amorphous silicon or silicon dioxide, for example, are popular, which can be polished to roughnesses of 0.2 nm rms and less. They often have a thickness between 10 µm and 30 µm, which can lead to a layer stress in the range of about 50 to 300 N/mm² for a polished layer of a nickel phosphorus alloy. For use in EUV wavelengths around 13 nm, functional coating 46 on the basis of alternating molybdenum and silicon layers, for example, can have a thickness in the order of several hundreds of nanometers, wherein layer stresses of about 200 to 400 N/mm² or more can arise. Whether or not tensile or compressive stresses occur in each case, may also depend on the respective coating methods used.

To simplify the coating process in the production of the optical elements, in particular, it is advantageous to choose the material, and in the case of layer systems, as the case may be, the structure of coating 47 on second surface 43, or coating 48 on third surface 44, to match functional coating 46 on first surface 42. Any deformations can then be corrected by choosing the corresponding thickness of coatings 47 and 48. Preferably, the thickness of coating 48 on third surface 44 should best have the same thickness as functional coating 46 on first surface 42 to compensate the deformation across the entire optical element 40, and the thickness of coating 47 on the second surface should be slightly thinner than functional coating 46 on first surface 42 to correct deformations in the edge area.

If functional coating 46 includes an optically effective coating, in particular in the form of a multilayer system, and if coating 47 for compensating stresses in the edge area of functional coating 46 is also designed as a corresponding multilayer system, it has proven advantageous if the roughness on the surface area of first surface 42, on which the optically effective coating is applied, and the roughness on the surface area of second surface 43 have essentially comparable values, in particular in the high-frequency local frequency area, to minimize any effects the surface roughness could have on the layer stresses within coatings 46, 47, or on their compensation.

It should be noted that the edge deformation is caused by the presence of the functional coating on the substrate of the optical element. This edge deformation effect may additionally be caused by stresses between an optically effective coating and a polishable coating, which are partial coatings, one on top of the other, of the functional coating, which can also be compensated by the coatings of the adjacent surfaces. The contribution to the edge deformation can primarily be caused by stresses between the polishable coating and the optically effective coating arranged above it. In this case, the polishable layer can also be seen as a continuation of the substrate as far as the correction of the edge deformation is concerned, and the area formed by the material of the polishable layer of the side adjacent to the deformed edge can be provided with a compensating coating, preferably of the material of the optically effective coating, for stress compensation in the edge area. In the reverse case, in which the edge deformation in the presence of an optically effective coating and a polishable coating is primarily due to the stress of the polishable coating, the optically effective coating can be neglected as part of the functional coating with respect to the stress compensation and the correction of the edge deformation.

In the example shown in FIG. 4a, coating 48 on third surface 44 of substrate 41 is designed so that the thickness and the stress of coating 48 are essentially identical to the thickness and stress of functional coating 46 on first surface 42. Unlike conventional methods, in which special stress-reducing layers are provided between functional coating 46 and substrate 41, the global curvature of optical element 40 caused by functional coating 46 is compensated by coating 48 on the opposite surface 44. However, it is also possible to combine the compensation of the deformation in the edge area by coating the adjacent surface with a global stress compensation across the entire optical element using one or more stress-compensating layers between the substrate and the optically-effective coating, preferably between the polishable coating and the optically-effective coating.

The deformations in the area of edge 45, shown enlarged in FIG. 4b, are largely compensated by coating 47 on second surface 43. For this purpose, thickness $t_2$ and stress $\sigma_2$ of coating 47 on surface 43 were chosen such that, in combination with thickness $t_1$ and stress $\sigma_1$ of functional coating 46 on first surface 42, the condition $t_1 * \sigma_1 / t_2 * \sigma_2 = X$ is fulfilled, wherein X has a value between 0.8 and 5.0, preferably between 1.2 and 3.0, particularly preferably between 1.4 and 1.8. To achieve a corrective effect, coating 47 should have a smaller thickness than functional coating 46 if comparable stresses occur in both layers. It is advantageous, in particular, if the stresses in both layers are the same, meaning, for example, that tensile stresses are present in both layers or that compressive stresses are present in both layers. In the example shown in FIG. 4b, tensile stresses are present in both layers. The particularly preferred values for X are applicable, in particular, to optical elements, in which first surface 42 and second surface 43 are more or less at right angles to each other, or the surface area of first surface 42 is not too strongly curved, or functional coating 46 across the surface area of first surface 42 does not have excessive thickness variations. In optical elements having a cross section that deviates too much from the rectangular form, it can occur that the value of X has to be slightly corrected upwards or downwards to achieve optimum compensation of the deformation.

In particular, if other materials are chosen for coatings 47 and/or 48, than for functional coating 46, the operating temperature at which each optical element is to be used should be taken into account when choosing the parameters of each layer thickness, since additional stresses and thus also deformations could be induced due to different coefficients of thermal expansion. Preferably, the coefficients of thermal expansion of the coatings should also be matched to the coefficient of thermal expansion of the substrate material, and the temperatures at which the optical element is to be used should be taken into consideration. For example, temperature differences of up to about 80 K between rest and operating temperatures can be expected in EUV lithography apparatuses.

With edge deformations largely due to thermally induced stresses, it is preferable that the coefficient of thermal expansion of both the functional coating and of the coating on the second surface is either higher or lower than the coefficient of thermal expansion of the substrate. The greater the difference between the coefficient of thermal expansion of the coating on the second surface and that of the substrate, the better the edge deformations can be compensated even from small thicknesses of the coating on the second surface.

With edge deformations largely due to intrinsic stresses, caused by the coating method for each functional coating, it is preferable that the coefficient of thermal expansion of the coating on the second surface is about equal to the coefficient of thermal expansion of the substrate. Also for the case of largely thermally induced edge deformations, the difference between the coefficient of thermal expansion of the coating on the second surface and the coefficient of thermal expansion of the substrate can be chosen to be rather small. This has the advantage that the coating on the second surface can thus be thicker and consequently larger manufacturing tolerances are allowed.

In further variants, in which the edge deformations are largely caused by growth induced layer stresses in the functional coating, the coefficient of thermal expansion of the coating on the second surface advantageously has the same sign as the coefficient of thermal expansion of the substrate, to reduce the influence of possible additional thermally induced layer stresses and to be able to compensate the edge deformation as well as possible. Preferably and additionally, the coefficient of thermal expansion of the coating on the second surface is about equal to the coefficient of thermal expansion of the substrate, to enhance this effect.

Typical coefficients of thermal expansion are, for example, in the range of about $8*10^{-6}$ $K^{-1}$ for molybdenum-silicon multilayer systems, of about $0.5*10^{-6}$ $K^{-1}$ for fused silica, of about $2.6*10^{-6}$ $K^{-1}$ for silicon, of about $23*10^{-6}$ $K^{-1}$ for aluminum, wherein the value for aluminum alloys, in particular with silicon, can be substantially lower, of about $17*10^{-6}$ $K^{-1}$ for copper and between about $11*10^{-6}$ $K^{-1}$ and about $25*10^{-6}$ $K^{-1}$ for various types of steel.

Figure 5:
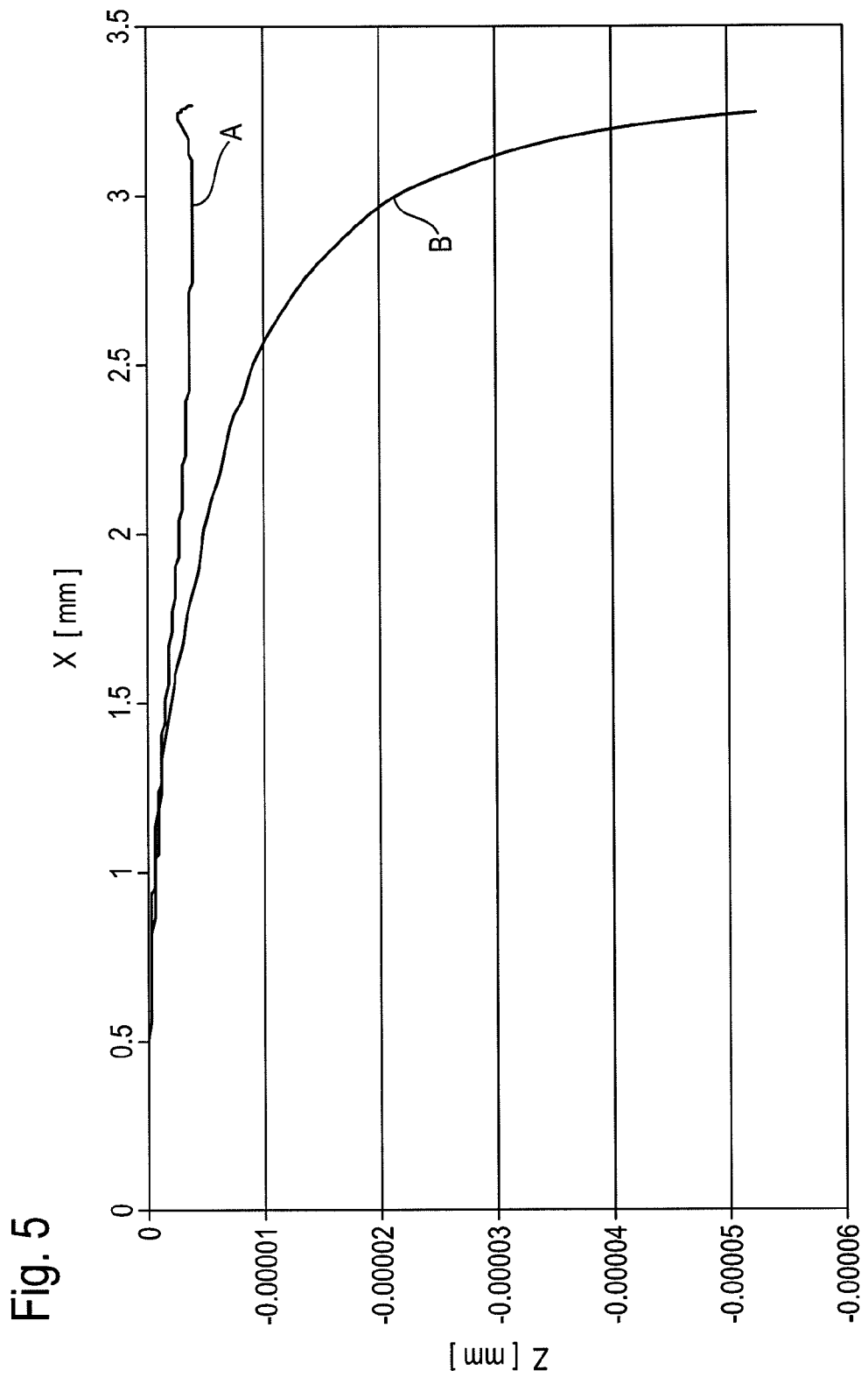
FIG. 5 shows deformations in an embodiment of an optical element provided with an additional coating, and in a comparable conventional optical element.

FIG. 5 shows the surface profile of the functional coating in the edge area of two different optical elements. Both optical elements in the example shown are aluminum substrates 3.25 mm×3.25 mm having a functional coating of nickel phosphorus alloy about 30 μm thick as a polishing layer, that can be used with an additional highly reflective coating, for example, as a facet of a facet mirror for UV or EUV lithography. One of the two optical elements additionally has a coating on the second surface of the substrate adjacent to the first surface having the functional coating. This coating is also of a nickel phosphorus alloy and has a thickness of about 17 μm. In both optical elements, the coatings extend up to the common edge.

FIG. 5 shows the deformation of the optical elements normal to the first surface with the functional coating. The area from the edge up to the center of the optical elements is shown. Curve A corresponds to an optical element, where the surface having a common edge with the surface with the functional coating, has a coating. Curve B corresponds to a conventional optical element, where there is no additional coating on the adjacent surface. In the conventional optical element, the deformation in the immediate edge area is in the order of several tens of nanometers. With the optical element having an additional layer on the surface adjacent to the surface having the functional coating, however, the deformation is in the order of only a few nanometers. The reduction of the deformation in the immediate edge area achieved with the additional coating of the adjacent surface is thus substantial. The deformation caused by the functional coating on the substrate is almost entirely compensated, which leads to improved imaging properties.

Figure 6:
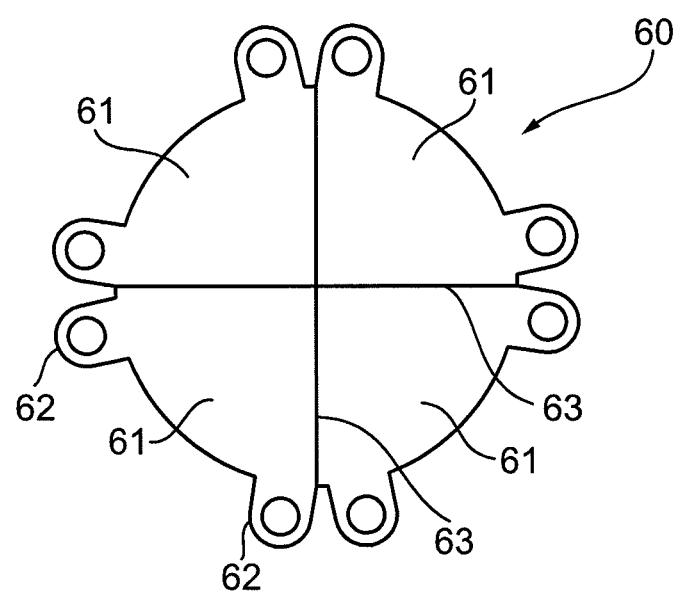
FIG. 6 schematically shows a mirror segment array of four optical elements formed as mirror segments.

FIG. 6 schematically shows a mirror segment array 60, composed of four mirror segments 61. The example shown here is a mirror segment array for the EUV wavelength range. However, mirrors for other wavelength ranges can also be formed as corresponding mirror segment arrays. Mirror segments 61 have tabs 62 for attachment purposes and, in some embodiments, also for actuating the individual mirror segments 61. In the edge areas 63, in particular, in which mirror segments 61 are adjacent to each other, the examples of mirror segments 61 shown in FIG. 6 can be regarded as triangular in a first approximation. The sides having common edge areas 63 with the top surface of each mirror segment 61, in the example shown here, have a coating to compensate deformations in edge areas 63 caused by any functional coating on the top surface of mirror segments 61. Mirror segments 61 are illuminated with EUV radiation beyond their edge areas 63, in particular toward the center of mirror segment array 60 in the lithography operation, so that deformations in this area would have a particularly interfering effect on the imaging properties of mirror segment array 60.

Figure 7A:
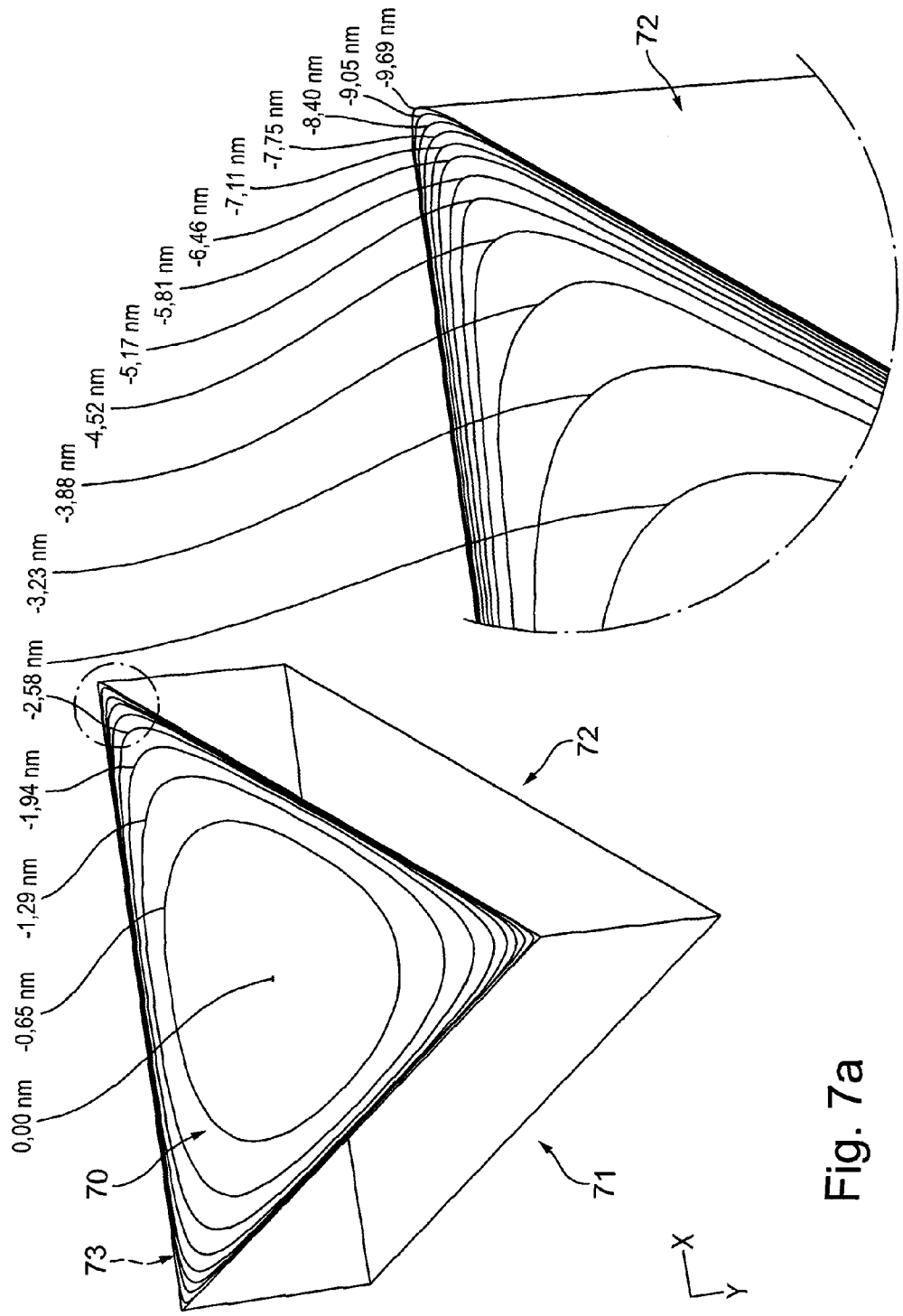
FIG. 7a shows the distribution of the deformations of an essentially triangular mirror segment only provided with a functional coating.
Figure 7B:
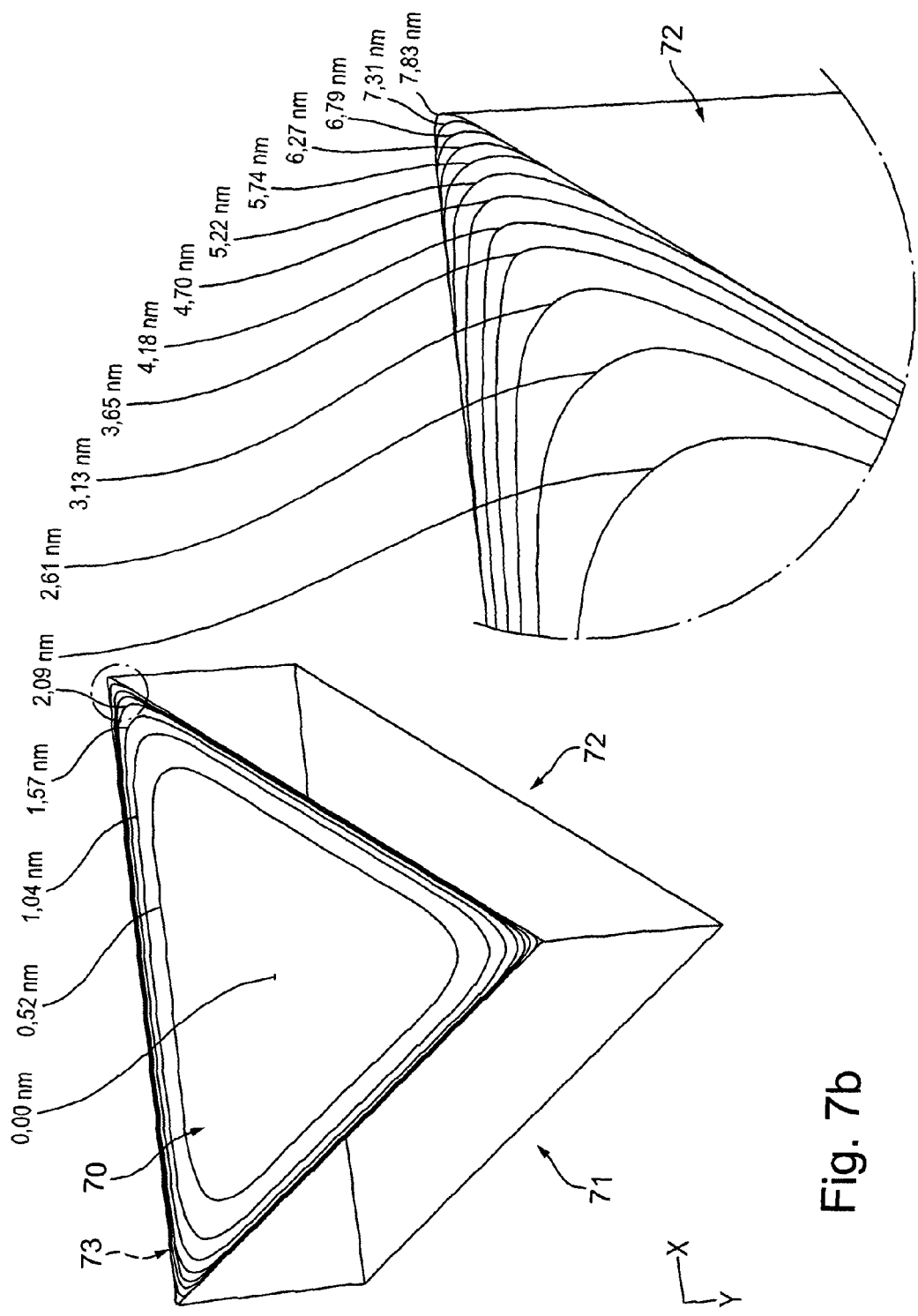
FIG. 7b shows the distribution of the deformations of an essentially triangular mirror segment with a coating only on the side surfaces.
Figure 7C:
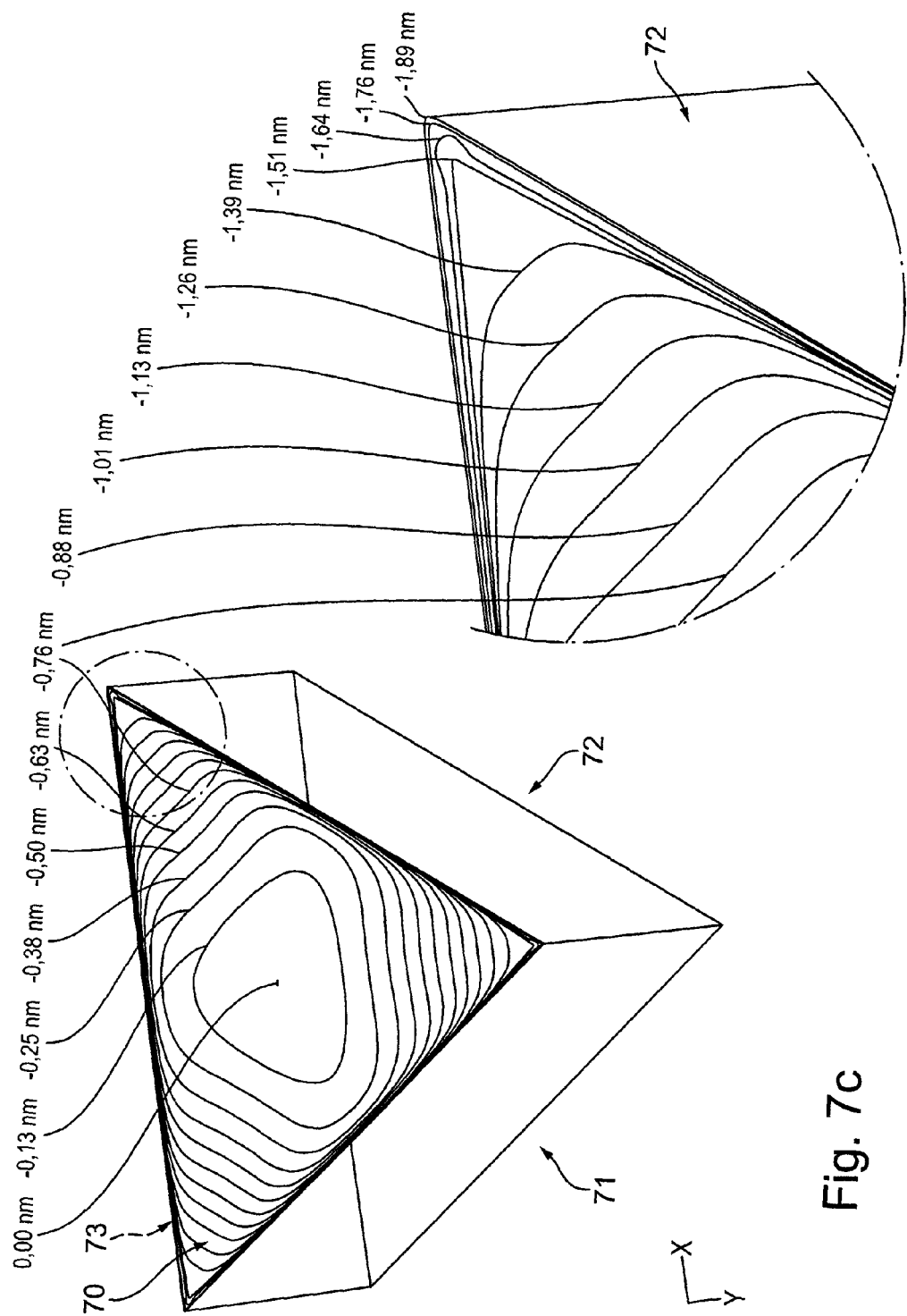
FIG. 7c shows the distribution of the deformations across the surface of a mirror segment, which is essentially triangular and which has a functional coating on its top surface and a coating on its side surfaces.

The deformations due to coatings on essentially triangular mirror segments have been subjected to closer study. The results are shown in FIGS. 7a to 7c. Substrates of titanium-doped fused silica of a thickness of 50 mm were investigated. The optical element shown in FIG. 7a had its surface 70 provided with a functional coating for the EUV wavelength range, namely a multilayer system on the basis of molybdenum and silicon. At a thickness of the functional coating of 500 nm and a layer stress of 100 MPa, an effective quantity σ*d of 50 MPa*μm results. Based on the height of mirror surface 70 at its center as a zero value, deformations of up to −9.69 nm result toward the edges.

The mirror segment, the deformations of which are shown in FIG. 7b, only has a coating on its side surfaces 71 and 72, or its hidden third side surface 73. The coating on the sides surfaces 71, 72, 73 was chosen such that its effective quantity is only half that of the layer stress of the functional coating, namely 25 MPa*μm. Deformations on the uncoated mirror surface 70 of up to 7.83 nm result in particular in the area of the common edge with the side surfaces 71, 72, 73.

Now, if the functional coating on surface 70 is combined with the additional coating on side surfaces 71, 72, 73 (cf. FIG. 7c), the deformation in the edge area can be substantially reduced, namely to only −1.89 nm maximum, against the zero value at the center of surface 70. This corresponds to a reduction of the deformation of surface 70 in the edge area by a factor of more than 5 compared with a mirror segment only having a functional coating, but no coating on the side surfaces (cf. FIG. 7a). Particularly preferred effective quantity ratios of the functional coating to the coating on the side surfaces, for these essentially triangular elements, are about 1.3 to 2.0. The material(s) for the coating on the side surfaces can be freely chosen for a given effective quantity, so that materials can be chosen primarily as to whether they are cheaply available and whether they can be applied with as little overhead as possible and by the usual coating methods.

A particular advantage, not only for mirror segments, is that the coating on the side surfaces can be carried out after applying the functional coating, so that concrete measuring of the actually arising deformations in the edge area can be carried out after this first coating step, and the coating on the side surfaces can be better optimized in light of the knowledge of the measuring results, in particular as regards its effective quantity.

In each of the examples shown in FIGS. 7a and 7c, the entire surface 70 was provided with the functional coating. In the examples shown in FIGS. 7b and 7c, the side surfaces 71, 72, 73 were also entirely provided with the additional coating. It should be noted that as early as when the side surfaces are coated, the deformation in the edge area caused by the functional coating can be selectively compensated.

The suggested additional coating of optical elements, which can be designed for use in the transmission or reflection mode, can simply and effectively compensate for deformations caused by the functional coating on the substrate.

The above description of the preferred embodiments has been given by way of example. From the disclosure given, those skilled in the art will not only understand the present invention and its attendant advantages, but will also find apparent various changes and modifications to the structures disclosed. The applicant seeks, therefore, to cover all such changes and modifications as fall within the spirit and scope of the invention, as defined by the appended claims, and equivalents thereof.

The invention claimed is:

1. An optical element configured for at least one of ultraviolet and extreme-ultraviolet lithography, comprising:
a substrate having a first surface and a second surface that has a common edge with the first surface,
a functional coating on the first surface, and
a coating on the second surface,
wherein the thickness $t_2$ and the stress $\sigma_2$ of the coating on the second surface in combination with the thickness $t_1$ and the stress $\sigma_1$ of the functional coating on the first surface fulfill the condition $$\frac{t_1 \cdot \sigma_1}{t_2 \cdot \sigma_2} = X,$$

wherein X has a value between 0.8 and 5.0.

2. The optical element according to claim 1, wherein the functional coating is configured as at least one of an optically effective coating and a polishable coating.

3. The optical element according to claim 1, wherein at least one of the functional coating on the first surface and the coating on the second surface extend to the common edge.

4. The optical element according to claim 1, wherein tensile stresses or compressive stresses stemming from at least one of the material and the thickness of the coating on the second surface are present also in the functional coating on the first surface.

5. The optical element according to claim 1, wherein X has a value between 1.2 and 3.0.

6. The optical element according to claim 5, wherein X has a value between 1.4 and 1.8.

7. The optical element according to claim 1, wherein the stress $\sigma_2$ of the coating on the second surface is at least approximately equal to the stress $\sigma_1$ of the functional coating on the first surface, in order to fulfill the condition $$\frac{t_1}{t_2} = X,$$

and wherein X has a value between 0.8 and 5.0.

8. The optical element according to claim 7, wherein X has a value between 1.2 and 3.0.

9. The optical element according to claim 8, wherein X has a value between 1.4 and 1.8.

10. The optical element according to claim 1, wherein the substrate has a third surface opposite the first surface, and further comprising a further coating on the third surface.

11. The optical element according to claim 10, wherein the product of the thickness $t_3$ and the stress $\sigma_3$ of the further coating on the third surface is at least approximately equal to the product of the thickness $t_1$ and the stress $\sigma_1$ of the functional coating on the first surface.

12. The optical element according to claim 1, wherein the coefficient of thermal expansion of both the functional coating and the coating on the second surface is greater than the coefficient of thermal expansion of the substrate.

13. The optical element according to claim 1, wherein the coefficient of thermal expansion of both the functional coating and the coating on the second surface is less than the coefficient of thermal expansion of the substrate.

14. The optical element according to claim 1, wherein the coefficient of thermal expansion of the coating on the second surface is at least approximately equal to the coefficient of thermal expansion of the substrate.

15. The optical element according to claim 1, wherein the coefficient of thermal expansion of the coating on the second surface has the same sign as the coefficient of thermal expansion of the substrate.

16. The optical element according to claim 1, wherein the coating on the second surface comprises at least one material from the group consisting of amorphous silicon, nickel-phosphorus alloy, diamond-like carbon, molybdenum, and silicon dioxide.

17. The optical element according to claim 1, wherein the substrate consists essentially of a material from the group consisting of copper, copper alloy, aluminum, aluminum alloy, aluminum-silicon alloy, fused silica, doped fused silica, titanium-doped fused silica, glass ceramic, calcium fluoride, silicon carbide, silicon-silicon carbide, and silicon.

18. The optical element according to claim 1, formed as a facet of a facet mirror or as a mirror segment of a mirror segment array.

19. An illumination system configured for at least one of ultraviolet and extreme-ultraviolet lithography, comprising:

at least one optical element comprising
    a substrate having a first surface and a second surface that has a common edge with the first surface,
    a functional coating on the first surface, and
    a coating on the second surface,
    wherein the thickness $t_2$ and the stress $\sigma_2$ of the coating on the second surface in combination with the thickness $t_1$ and the stress $\sigma_1$ of the functional coating on the first surface fulfill the condition $$\frac{t_1 \cdot \sigma_1}{t_2 \cdot \sigma_2} = X,$$

wherein X has a value between 0.8 and 5.0.

20. A lithography apparatus configured for at least one of the ultraviolet or extreme ultraviolet wavelength ranges, comprising:
    at least one optical element comprising
        a substrate having a first surface and a second surface that has a common edge with the first surface,
        a functional coating on the first surface, and
        a coating on the second surface,
        wherein the thickness $t_2$ and the stress $\sigma_2$ of the coating on the second surface in combination with the thickness $t_1$ and the stress $\sigma_1$ of the functional coating on the first surface fulfill the condition $$\frac{t_1 \cdot \sigma_1}{t_2 \cdot \sigma_2} = X,$$

wherein X has a value between 0.8 and 5.0.

\* \* \* \* \*